(12) United States Patent
Kim et al.

(10) Patent No.: US 7,795,743 B2
(45) Date of Patent: Sep. 14, 2010

(54) WIRING SUBSTRATE HAVING VARIOUSLY SIZED BALL PADS, SEMICONDUCTOR PACKAGE HAVING THE WIRING SUBSTRATE, AND STACK PACKAGE USING THE SEMICONDUCTOR PACKAGE

(75) Inventors: Tae-Hun Kim, Chungcheongnam-do (KR); Hak-Kyoon Byun, Chungcheongnam-do (KR); Sung-Yong Park, Gyeonggi-do (KR); Heung-Kyu Kwon, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 701 days.

(21) Appl. No.: 11/539,133

(22) Filed: Oct. 5, 2006

(65) Prior Publication Data

US 2007/0152350 A1   Jul. 5, 2007

(30) Foreign Application Priority Data

Jan. 4, 2006   (KR) ...................... 10-2006-0000794

(51) Int. Cl.
    H01L 23/48   (2006.01)
(52) U.S. Cl. .......... 257/786; 257/E23.02; 257/E23.069; 257/E23.07; 257/E23.194; 257/E25.013; 257/778; 257/737; 257/738; 257/772; 257/776; 257/668; 257/773; 257/780; 257/779
(58) Field of Classification Search ................. 257/786, 257/E23.02, E23.069, E23.07, E23.194, E25.013, 257/E25.023, 778, 737, 738, 772, 775, 776, 257/773, 780, 779, 668
    See application file for complete search history.

(56) References Cited

U.S. PATENT DOCUMENTS

| 7,242,093 B2 * | 7/2007 | Ueda ........................... 257/737 |
| 7,277,298 B2 * | 10/2007 | Ohsaka ........................ 361/760 |
| 2003/0114024 A1 * | 6/2003 | Miyagawa .................... 439/68 |

(Continued)

FOREIGN PATENT DOCUMENTS

JP   9-51015   *   2/1997

(Continued)

OTHER PUBLICATIONS

English language abstract of Korean Publication No. 2002-0065045.

(Continued)

*Primary Examiner*—Alexander O Williams
(74) *Attorney, Agent, or Firm*—Volentine & Whitt, PLLC

(57) ABSTRACT

A wiring substrate having variously sized ball pads, a semiconductor package including the wiring substrate, and a stack package using the semiconductor package, to improve board level reliability (BLR) of a semiconductor package or stack package mounted on a mother board are shown. Outer ball pads are formed to have relatively greater surface areas at the corners of the semiconductor package as compared to those at other areas and are formed to have the greatest surface area within a designable range. Additionally, occurrence of cracks may be inhibited at junctions of other solder balls by forming dummy solder pads at the outermost corners among the outer ball pads formed proximate to the corners of the wiring substrate. Stress arising during a board level reliability test is absorbed without product failure at junctions between the dummy solder pads and dummy solder balls.

26 Claims, 8 Drawing Sheets

U.S. PATENT DOCUMENTS

| | | | |
|---|---|---|---|
| 2003/0201122 A1* | 10/2003 | Hsu et al. | 174/260 |
| 2004/0222510 A1 | 11/2004 | Aoyagi | |
| 2007/0096287 A1* | 5/2007 | Araki et al. | 257/686 |
| 2008/0150116 A1* | 6/2008 | Jang et al. | 257/686 |
| 2009/0020885 A1* | 1/2009 | Onodera | 257/777 |

FOREIGN PATENT DOCUMENTS

| | | |
|---|---|---|
| JP | 2004-281818 | 10/2004 |
| JP | 2004-289002 | 10/2004 |
| KR | 2002-0065045 | 8/2002 |

OTHER PUBLICATIONS

English language abstract of Japanese Publication. No. 2004-281818.

English language abstract of Japanese Publication No. 2004-289002.

\* cited by examiner

WIRING SUBSTRATE HAVING VARIOUSLY SIZED BALL PADS, SEMICONDUCTOR PACKAGE HAVING THE WIRING SUBSTRATE, AND STACK PACKAGE USING THE SEMICONDUCTOR PACKAGE

PRIORITY STATEMENT

This U.S. non-provisional application claims benefit of priority under 35 U.S.C. §119 from Korean Patent Application No. 2006-794, filed on Jan. 4, 2006, the entire contents of which are incorporated herein by reference.

BACKGROUND

1. Field of the Invention

The present invention relates generally to a semiconductor package technology and, more particularly, to a wiring substrate capable of improving board level reliability (BLR), a semiconductor package having the wiring substrate, and a stack package using the semiconductor package.

2. Description of the Related Art

As small, thin and light semiconductor packages are pursued in the miniaturization of electronic mobile devices, capacities of semiconductor chips to be mounted on the semiconductor packages have increased. To increase the capacity of a semiconductor chip, a technology that can install more cells in a limited space of the semiconductor chip is required. Such a technology requires a patterning technology in precise micro-line widths and long development time. Alternatively, methods of high integration using semiconductor chips or semiconductor packages already developed, for example stacked chip packages with three-dimensionally stacked semiconductor chips and stack packages with three-dimensionally stacked semiconductor packages, have been actively studied recently. In other words, higher capacity has been reached by combining existing, e.g., already developed, multiple semiconductor chips or packages.

Three-dimensionally stacked chip packages, e.g., fabricated by three-dimensionally stacking a plurality of semiconductor chips, can accomplish high integration and effectively respond to requirements for light, thin and small semiconductor products. If reliability for the stacked semiconductor chips is not acquired, however, a yield decrease can occur. That is, if any one failed, e.g., bad, semiconductor chip is included in the stacked semiconductor chips, the final three-dimensionally stacked chip package as a whole fails without possibility of repair.

On the other hand, although three-dimensional stack packages fabricated by three-dimensionally stacking a plurality of semiconductor packages have a problem of too great a thickness compared with the stacked chip packages, high integration may be accomplished, and the problem of yield decrease of the three-dimensionally stacked stack packages may be overcome by using semiconductor packages that have passed a reliability test.

A stack package may be fabricated by stacking ball grid array (BGA) type semiconductor packages. A lower package of the stack package has a structure in which a semiconductor chip is mounted on the central part of the upper surface of a wiring substrate, sealed by a resin encapsulating section, and solder balls are formed on lower ball pads of the lower surface of the wiring substrate. Upper ball pads are uniformly formed on the upper surface of the wiring substrate outside the resin encapsulating section so that an upper package can be stacked on the lower package, e.g., by solder bonding. That is, solder balls of the upper package are attached on the upper ball pads of the lower package by way of solder bonding.

The solder balls of the lower-most package are used as external connection terminals of the overall stack package. That is, the stack package is connected to a motherboard through the solder balls of the lower package.

Because the lower package has the resin encapsulating section on the central part of the wiring substrate, an upwardly convex warp or deformation occurs in the central part of the wiring substrate. Because the lower ball pads formed on the wiring substrate of the lower package all have the same surface area, the solder balls have also all the same size.

Due to such upwardly convex warp or deformation in the wiring substrate of the lower package, the distances between the upper surface of a motherboard and lower ball pads at the central part of the lower package differ from the distances between the upper surface of the motherboard and lower ball pads on the periphery of the lower package (hereinafter referred to as 'distance difference'). This distance difference decreases a solder bonding ability of the lower package to the motherboard.

To solve such a problem, and as disclosed in U.S. Patent Publication No. 2004/0222510, the surface areas of the lower ball pads gradually increase from the central part of the wiring substrate to the periphery thereof as the pad separation decreases in consideration of the warped shape of the lower package wiring substrate. Similarly, the surface areas of the lower ball pads gradually decrease from the central part of the wiring substrate to the periphery thereof as the pad separation increases.

With the above method, the problem due to the distance difference of the lower ball pads of the lower package may be decreased and thereby bonding reliability to the motherboard may be improved.

However, cracks may occur at junctions of solder balls located at the corners of the stack package when a board level reliability test for a stack package mounted on the motherboard is performed. The board level reliability test includes tests of drop impact, bending fatigue, temperature cycle and keypad strike. Particularly, cracks of the solder balls often occur during drop impact and temperature cycle testing.

Although the outermost solder balls have greater contact areas with lower ball pads than central solder balls, because mechanical stresses are substantially concentrated on the corners of the wiring substrate, e.g., during the board level reliability test, cracks undesirably occur at junctions of the outermost solder balls, especially those disposed at the corners of the wiring substrate.

SUMMARY

Embodiments of the present invention can inhibit occurrence of fault-producing cracks at junctions of solder balls disposed at the corners of a wiring substrate when a board level reliability test is performed. Further, embodiments of the present invention continue operation as a semiconductor package even when cracks occur at junctions of solder balls disposed at the corners of a wiring substrate.

DETAILED DESCRIPTION OF EXAMPLE EMBODIMENTS

Hereinafter, example embodiments of the present invention are described in detail with reference to the accompanying drawings.

Wiring Substrate

Figure 1:
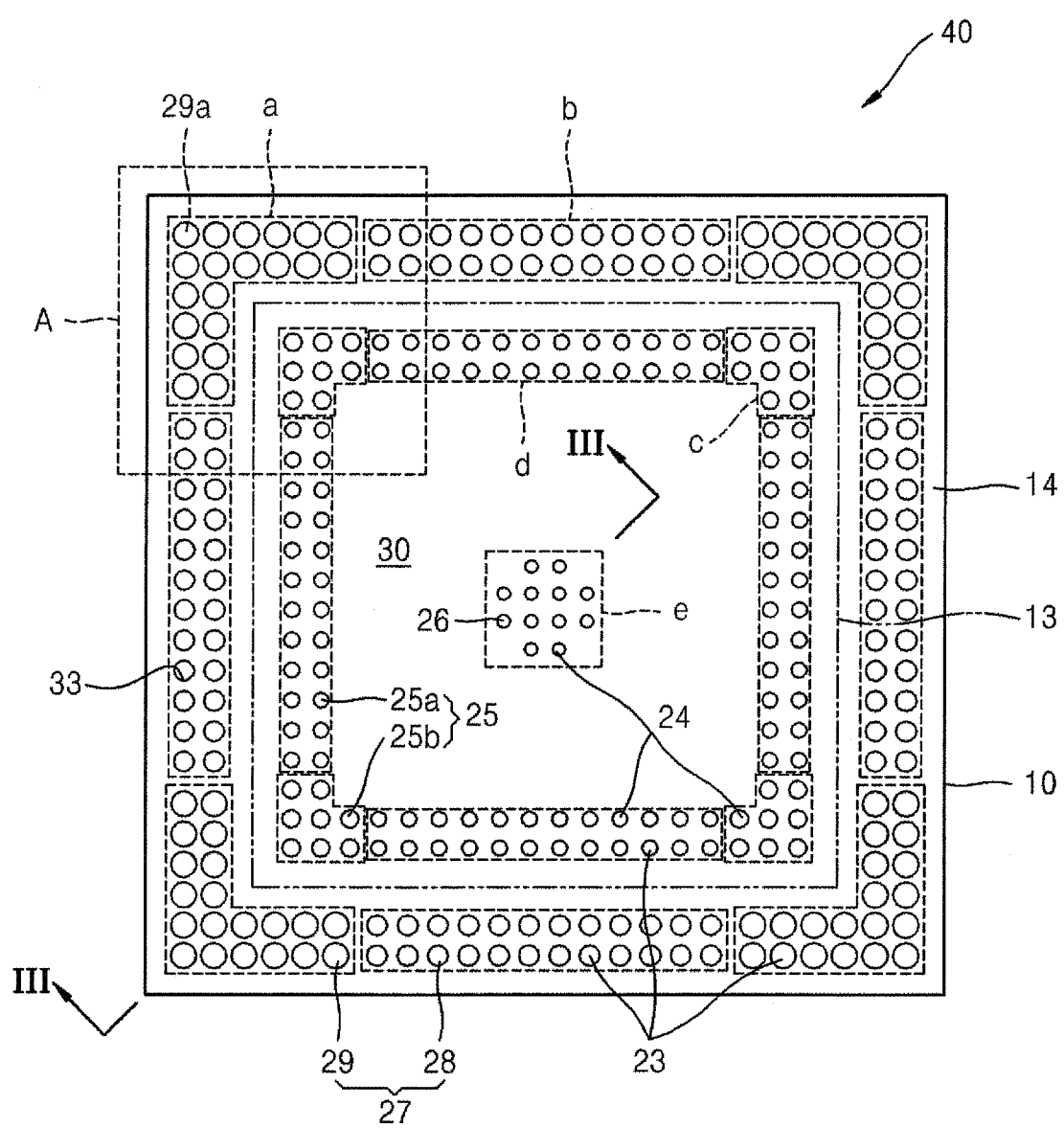
FIG. 1 is a bottom view showing a wiring substrate for a semiconductor package according to an example embodiment of the present invention.
Figure 2:
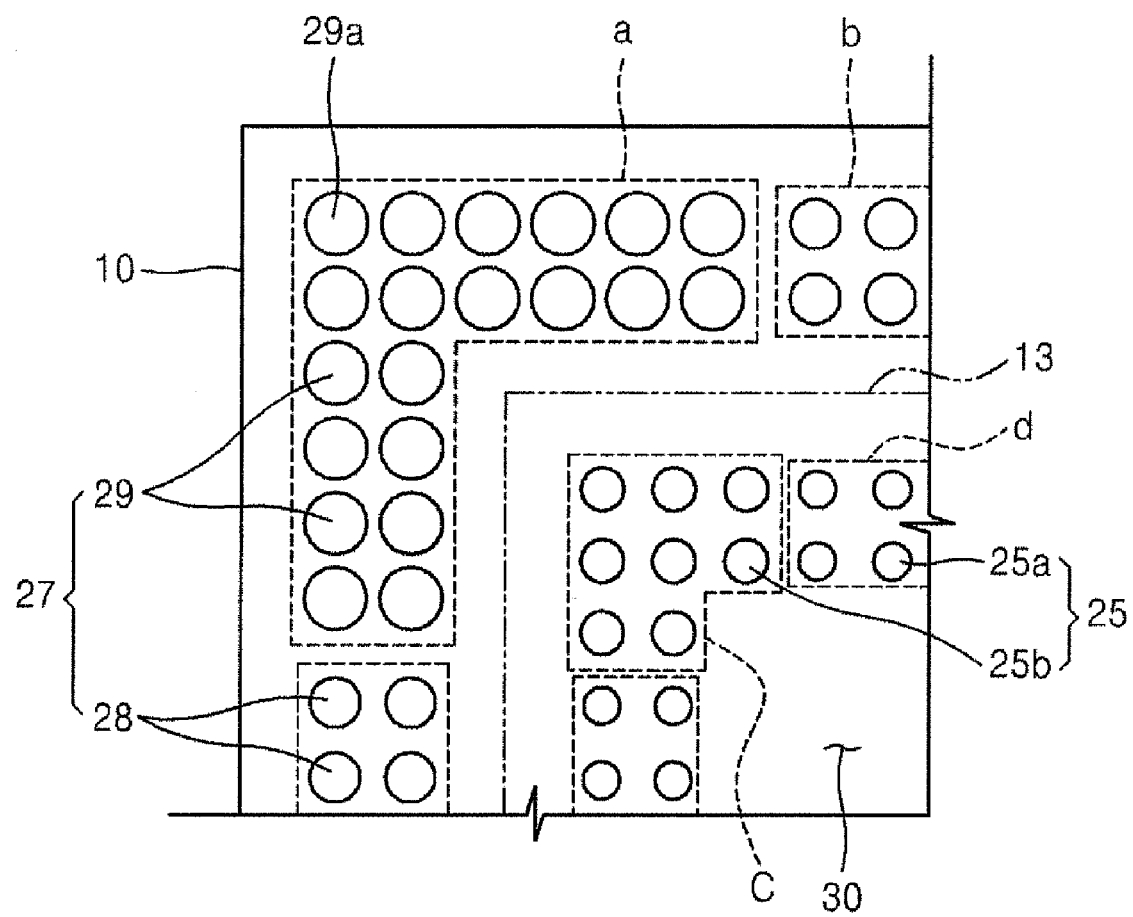
FIG. 2 is an enlarged view of the portion 'A' of FIG. 1.
Figure 3:
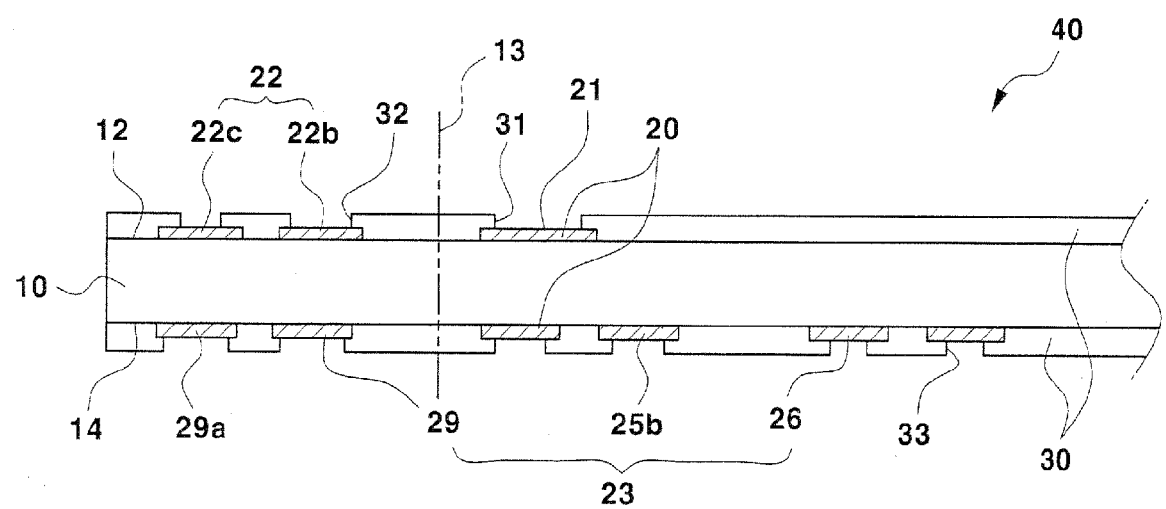
FIG. 3 is a sectional view of the wiring substrate of FIG. 1 taken along the line III-III

FIG. 1 is a bottom view showing a wiring substrate 40 for a semiconductor package according to an example embodiment of the present invention. FIG. 2 is an enlarged view of the portion 'A' of FIG. 1. FIG. 3 is a sectional view of the wiring substrate 40 of FIG. 1 as taken along the line III-III of FIG. 1.

Referring to FIGS. 1-3, the wiring substrate 40 according to an example embodiment of the present invention includes a substrate body 10 having an upper surface 12 and a lower surface 14, conductive wiring layers, e.g., metal wiring layers 20 formed on the surfaces 12 and 14 of the substrate body 10, and insulating protection layers 30 covering the surfaces 12 and 14 of the substrate body 10 and protecting the metal wiring layers 20.

The substrate body 10 is an insulating plate of, for example, a square shape having a predetermined thickness, and having a resin encapsulating area 13 on the central part of the upper surface 12. A semiconductor chip will be mounted on the central part of the resin encapsulating area 13. Prepreg, glass-epoxy resin, BT Resin, polyimide, ceramic or silicon may be used as a raw material of the substrate body 10. The wiring substrate 40 may be a printed circuit board, tape wiring substrate, ceramic substrate or silicon substrate.

The metal wiring layers 20 are formed, for example, by attaching copper foils on surfaces 12 and 14 of the substrate body 10 and patterning in a photolithography process. The metal wiring layers 20 comprise an upper wiring layer formed on the upper surface 12 of the substrate body 10, and a lower wiring layer formed on the lower surface 14 of the substrate body 10. The upper wiring layer and lower wiring layer are electrically connected to each other, e.g., through a vias penetrating the substrate body 10 (not shown), and at least one inner wiring layer may be further formed within the substrate body 10.

The upper wiring layers include bonding pads 21 formed inside the resin encapsulating area 13, and upper ball pads 22 formed outside the resin encapsulating area 13 and each connected to a bonding pad 21. Solder balls attached to an upper package can be connected on the upper ball pads 22. Although the upper ball pads 22 are arranged in two row substantially square shapes outside the resin encapsulating area 13 in this particular example embodiment of the present invention, the present invention is not limited thereto.

The lower wiring layers comprise lower ball pads 23 formed on the lower surface 14 of the substrate body 10. Solder ball pads, e.g., used for external connection terminals, will be attached on the lower ball pads 23.

The bonding pads 21, upper ball pads 22 and lower ball pads 23 are exposed outwardly through openings 31, 32 and 33, respectively, formed in the protection layers 30. A photo solder resist, on which patterning is possible by photolithography, may be used for the protection layers 30.

The surface areas of the upper ball pads 22 and lower ball pads 23 exposed through both surfaces of the wiring substrate 40 are determined, in this particular embodiment, by the sizes of openings 32 and 33 defined by the protection layers 30. Although only selected, e.g., central, surface areas of the upper ball pads 22 and lower ball pads 23 are thereby exposed through both surfaces of the wiring substrate 40 by covering with the protection layers 30 in this example embodiment of the present invention, whole surface areas of the upper ball pads 22 and lower ball pads 23 may be exposed. The former is called a solder mask defined (SMD) type wiring substrate, and the latter is called a non-solder mask defined (NSMD) type wiring substrate. In the SMD type wiring substrate 40, as disclosed in the example embodiment herein, the "surface areas" of the upper ball pads 22 and lower ball pads 23 are determined by the sizes of openings 32 and 33 respectively. However, upper ball pads and lower ball pads should be formed to have different surface areas in the NSMD type wiring substrate because the whole surface areas of the upper ball pads and lower ball pads exposed through the openings are used in NSMD type wiring substrates. In other words, "surface area" as used herein refers to either exposed or effective surface area. To implement variation in pad "surface area" under SMD type methods a fixed actual size of the pad may be used with "surface area" determined by the size of exposure opening whereas in NSMD type methods variation in the actual size of the pad is used. In either case, the "surface area", as such term is used herein, is selectively varied as described herein.

As described above, the bonding pads 21, upper ball pads 22 and lower ball pads 23 exposed through both surfaces of the wiring substrate 40 are formed with copper, which has good electrical conductivity. When the copper is exposed to the air, however, an oxidized film may form on the surface, and the oxidized film inhibits bonding ability between bonding wires and solder balls. Although not shown in the drawings, to prevent such oxidation, nickel/gold (Ni/Au) layers are generally formed on the copper layers forming the bonding pads 21, and organic solderability preservative (OSP) layers may be formed on the copper layers forming the upper ball pads 22 and lower ball pads 23.

The lower ball pads 23 comprise inner ball pads 24 formed on the lower surface 14 of the substrate body 10 corresponding to the resin encapsulating area 13, and outer ball pads 27 arranged to form substantially square shapes on the lower surface 14 of the substrate body 10 and corresponding to an area outside the resin encapsulating area 13. The outer ball pads 27 have relatively greater surface areas than the inner ball pads 24.

The outer ball pads 27 comprise first outer ball pads 28 and second outer ball pads 29. The first outer ball pads 28 are formed on areas along each side of the lower surface 14. The second outer ball pads 29 are formed at the corners of the lower surface 14 to form substantially square shapes together with the first outer ball pads 28. The second outer ball pads 29 have relatively greater surface areas than the first outer ball pads 28.

An area b of the first outer ball pads 28 is formed in a linear line shape, and an area a of the second outer ball pads 29 at a corner of the lower surface 14 is formed in an 'L' shape. The outer ball pads 27 are formed in a plurality of rows; two rows are formed in the example embodiment of the present invention.

Particularly, the second outer ball pads 29 formed at the corners of the wiring substrate 40 at which mechanical stresses are concentrated during a board level reliability test are formed to have the greatest surface area within a designable range. Thus, by securing maximum contact areas with the solder balls, cracks may be inhibited at junctions between the second outer ball pads 29 and solder balls.

The second outer ball pads 29 may comprise dummy ball pads 29a formed at the outermost corners of the lower surface 14. The greatest mechanical stresses are applied at the corners of the wiring substrate 40 when a board level reliability test is performed. Cracks of solder balls attached to other lower ball pads 23 may be inhibited by inducing the cracks occurring in solder balls during the board level reliability test to occur in those solder balls attached to the dummy ball pads 29a at the corners of the wiring substrate 40. Although the dummy ball pads 29a are formed in a round shape in the example embodiment of the present invention, the present invention is not limited thereto, and the dummy ball pads 29a may be formed in a substantially square or triangular shape, e.g., corresponding to the corner.

The inner ball pads 24 comprise first inner ball pads 25 arranged to form substantially square shapes corresponding to the outer ball pads 27, and second inner ball pads 26 formed at the central part of the first inner ball pads 25.

The first inner ball pads 25 comprise side first inner ball pads 25a and corner first inner ball pads 25b. The side first inner ball pads 25a are formed corresponding to the first outer ball pads 28. The corner first inner ball pads 25b are formed corresponding to the second outer ball pads 29, arranged to form substantially square shapes together with the side first inner ball pads 25a, and have relatively greater surface areas than the side first inner ball pads 25a. An area d of the side first inner ball pads 25a is formed in a linear line shape, and an area c of the corner first inner ball pads 25b formed at a corner may be formed in an 'L' shape.

The first inner ball pads 25 are formed in a plurality of rows; two rows are formed in the example embodiment of the present invention.

The second inner ball pads 26 are arranged in a lattice shape, and formed to have relatively smaller surface areas than the first inner ball pads 25. Particularly, the second inner ball pads 26 are formed to have the minimum surface area within a designable range to reduce the height difference between solder balls formed on the second outer ball pads 29 and solder balls of the second inner ball pads 26. The reference symbol e designates an area of the second inner ball pads 26.

The area a of the second outer ball pads 29 is preferably greater than the area c of the corner first inner ball pads 25b. The areas b and d of the first outer ball pads 28 and the side first inner ball pads 25a, respectively, may be formed in the same length.

Figure 4:
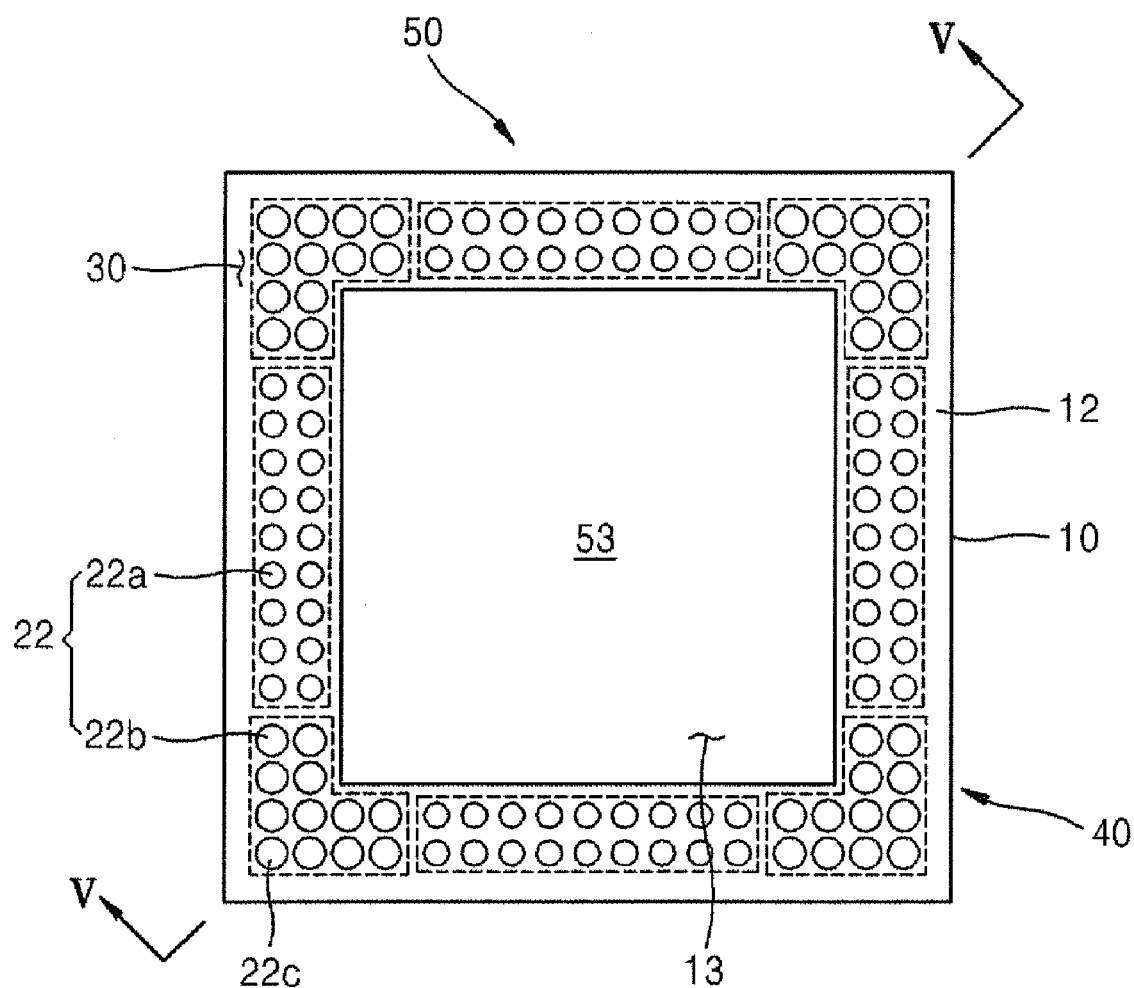
FIG. 4 is a top view showing a semiconductor package having the wiring substrate of FIG. 1.

As shown in FIG. 4 which is a top view of a semiconductor package having a wiring substrate 40, upper ball pads 22 comprise first upper ball pads 22a and second upper ball pads 22b. The first upper ball pads 22a are formed on areas at each side of the upper surface 12. The second upper ball pads 22b are formed at the corners of the upper surface 12 to form substantially square shapes together with the first upper ball pads 22a, and formed to have a relatively smaller surface area than the first upper ball pads 22a. They may be applied in the case that upwardly concave warpage occurs at the central part of an upper package to be attached to the upper ball pads 22.

However, in the case that upwardly convex warpage occurs at the upper package, the second upper ball pads 22b may be formed to have a relatively greater surface area than the first upper ball pads 22a.

Additionally, the second upper ball pads 22b may comprise dummy ball pads 22c formed at the outermost corners of the upper surface 12.

Semiconductor Package

Figure 5:
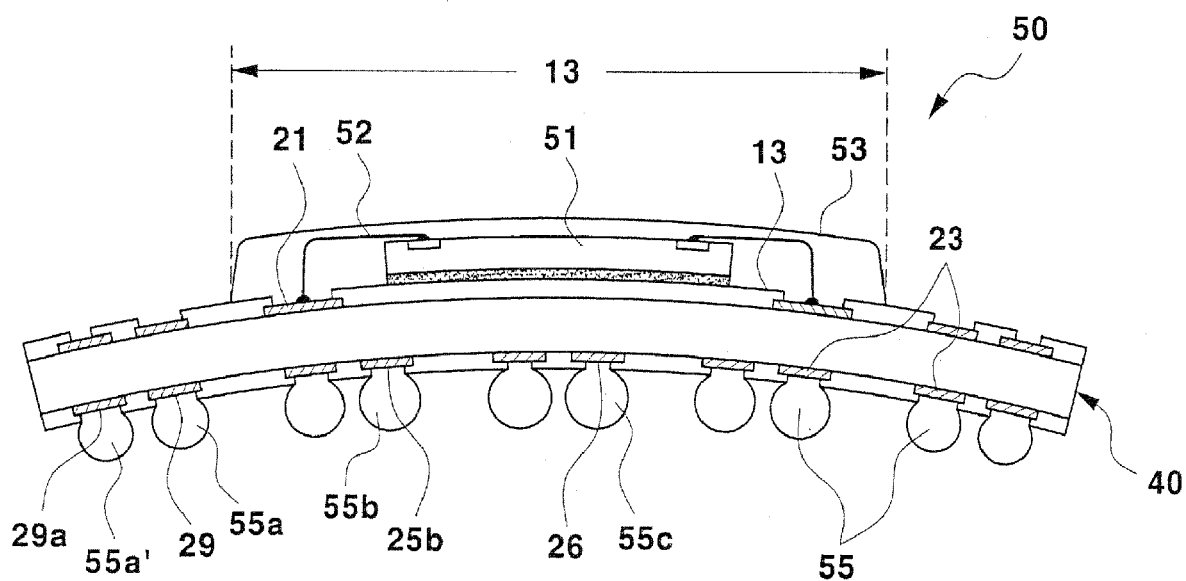
FIG. 5 is a sectional view of the semiconductor package of FIG. 4 taken along the line V-V.
Figure 6:
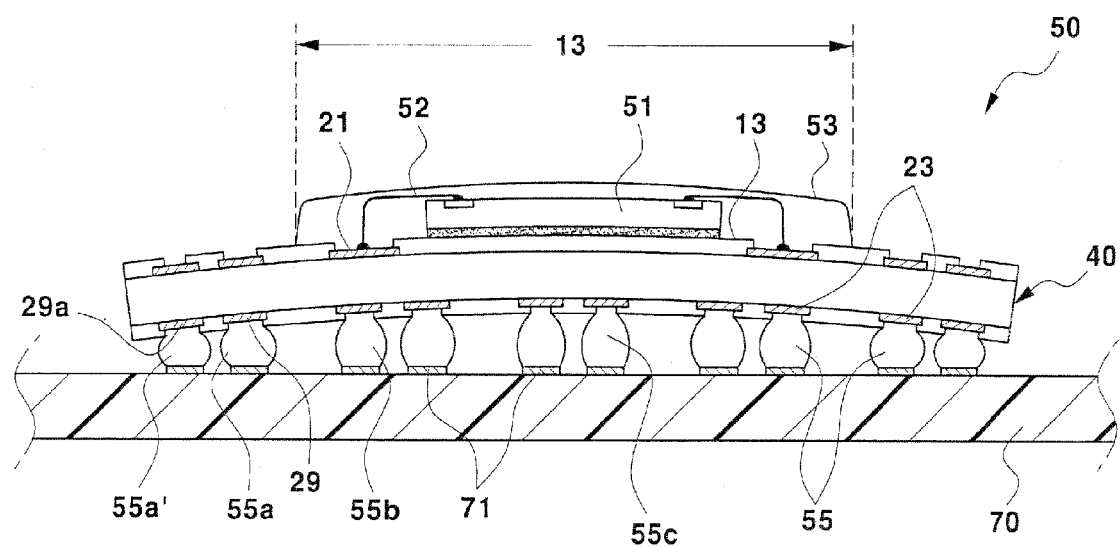
FIG. 6 is a sectional view showing a state in which the semiconductor package of FIG. 4 is mounted on a motherboard.

A semiconductor package 50 according to another example embodiment of the present invention, having the wiring substrate 40, is shown in FIGS. 4 to 6. FIG. 4 is a top view showing the semiconductor package 50 having the wiring substrate 40 of FIG. 1. FIG. 5 is a sectional view of the semiconductor package 50 of FIG. 4 taken along line V-V. FIG. 6 is a sectional view showing a state in which the semiconductor package 50 of FIG. 4 is mounted on a motherboard 70.

Referring to FIGS. 4 to 6, the semiconductor package 50 is a BGA type semiconductor package in which a semiconductor chip 51 is mounted on the upper surface of the wiring substrate 40, and solder balls 55 are formed on the lower surface of the wiring substrate 40. The semiconductor chip 51 is attached on the central part of a resin encapsulating area 13 of the wiring substrate 40. The semiconductor chip 51 is electrically connected to bonding pads 21 by bonding wires 52. The resin encapsulating area 13 at which the semiconductor chip 51 and bonding wires 52 are installed is sealed by a resin encapsulating section 53 formed with top gate molding. Solder balls 55 are formed on lower ball pads 23 of the lower surface of the wiring substrate 40.

The solder balls 55 may be attached by coating the lower ball pads 23 with flux, positioning the solder balls of a ball shape thereon and reflowing.

Solder balls 55a formed on second outer ball pads 29 have the greatest contact areas and the least heights of all the solder balls 55, while solder balls 55c formed on second inner ball pads 26 have the smallest contact areas and the greatest heights of all the solder balls 55. The reference symbol 55b designates solder balls formed on corner first inner ball pads 25b.

Because height difference between the solder balls 55a and 55c formed on the second outer ball pads 29 and second inner ball pads 26, respectively, may be minimized due to the above structure, as shown in FIG. 6, good bonding reliability to a motherboard 70 may be acquired. The semiconductor package 50 is solder-bonded to board pads 71 of the motherboard 70 through the solder balls 55.

In first outer ball pads 28 and second outer ball pads 29 arranged to form substantially square shapes in FIG. 2, the reason for the second outer ball pads 29 at the corners being formed to have a relatively greater surface area than the first outer ball pads 28 is that warpage occurs relatively severely at the corners. Accordingly, board level reliability may be increased by forming the second outer ball pads 29, which are influenced most highly by warpage, of a relatively greater surface area than the first outer ball pads 28 in FIG. 2.

Particularly, because the second outer ball pads 29 having the greatest surface area are formed at the outermost corners of the lower surface of the wiring substrate 40, when a board level reliability test is preformed after the semiconductor package 50 is mounted on the motherboard 70, occurrence of cracks may be inhibited at junctions between solder balls 55a and second outer ball pads 29 disposed at the corners of the wiring substrate 40. That is, because the contact areas between the solder balls 55a and second outer ball pads 29 are maximized, areas that can absorb mechanical stresses occurring during the board level reliability test are increased, and thereby occurrence of cracks may be inhibited at the junctions of the solder balls 55a and second outer ball pads 29.

By forming dummy ball pads 29a and dummy solder balls 55a' at the outermost corners among the solder balls 55a formed at the corners, stresses acting during the board level reliability test may be induced to be absorbed to the dummy solder balls 55a'. As a result, if cracks of the solder balls occur, cracks occur firstly at junctions of the dummy solder balls 55a', and occurrence of cracks may be inhibited at junctions of other solder balls 55a, 55b and 55c.

Although the semiconductor chip 51 is electrically connected to the wiring substrates 40 by a wire bonding method in the example embodiment of the present invention, the semiconductor chip may be bonded to the wiring substrate by a flip chip bonding method.

Stack Package

Figure 7:
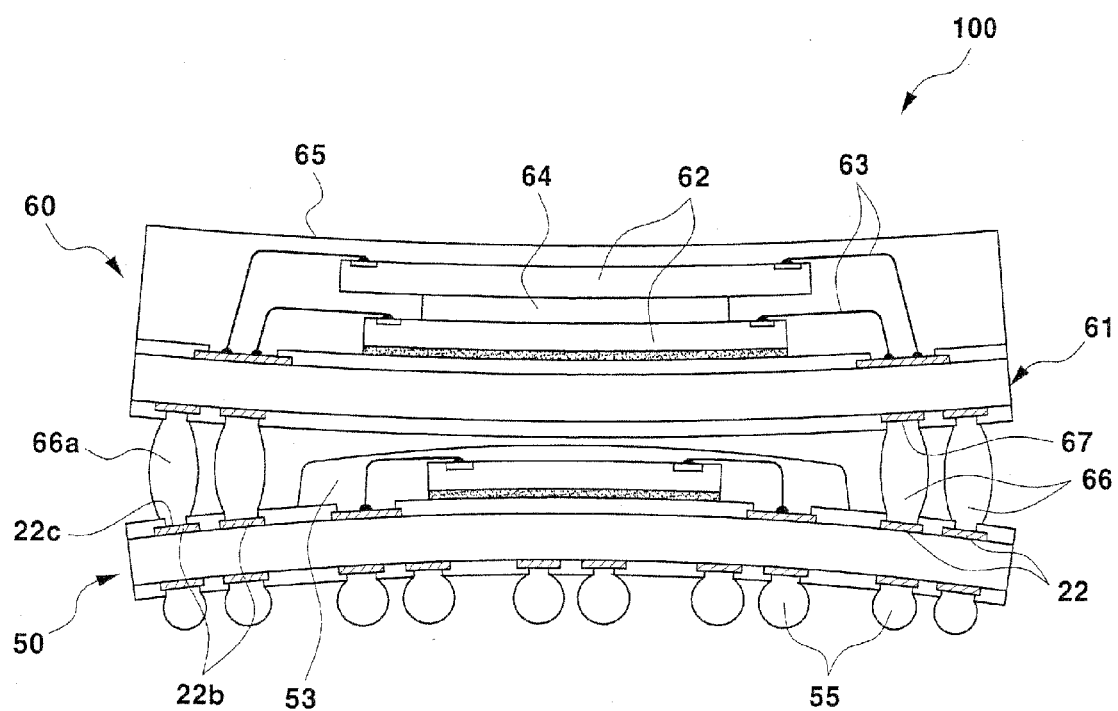
FIG. 7 is a sectional view showing a stack package using the semiconductor package of FIG. 4 as a lower package.

A stack package 100 according to another example embodiment of the present invention, using the semiconductor package 50 as a lower package, is shown in FIG. 7. Referring to FIG. 7, the stack package 100 has a structure in which an upper package 60 is solder-bonded to the upper surface of the lower package 50. Solder balls 66 of the upper package 60 are attached on upper ball pads 22 of the lower package 50 by solder bonding.

The upper package 60 is a kind of stacked chip package having two semiconductor chips 62 stacked on the upper surface of the wiring substrate 61, and a spacer 64 is interposed between the two semiconductor chips 62. The semiconductor chips 62 are electrically connected to the wiring substrate 61 by bonding wires 63. The semiconductor chips 62 and bonding wires 63 mounted on the upper surface of the wiring substrate 61 are sealed by a resin encapsulating section 65. The solder balls 66 are formed on the lower surface of the wiring substrate 61. The solder balls 66 have greater heights than the height of a resin encapsulating section 53 of the lower package 50 so that the wiring substrate 61 of the upper package 60 is attached at a predetermined distance from the resin encapsulating section 53 of the lower package 50.

Because the resin encapsulating section 65 is formed to cover the whole upper surface of the wiring substrate 61, warpage of the upper package 60 occurs at the central part in an upwardly concave shape in contrast to that of the lower package 50. Accordingly, ball pads 67 are formed in a contrasting direction of surface area increase to the lower ball pads 23 of the lower package 50. That is, whereas the surface areas of the lower ball pads 23 increase generally towards the outer periphery of the lower package 50, the surface areas of the ball pads 67 increase generally towards the center of the upper package 60. In addition, the surface areas of the upper ball pads 22 may increase generally towards the center of the lower package 50.

Because second upper ball pads 22b of the lower package 50 include dummy ball pads 22c at the outermost corners of the upper surface, occurrence of cracks may be inhibited at junctions of other solder balls 66 by absorbing stresses acting during a board level reliability test at junctions between the dummy solder pads 22c and dummy solder balls 66a.

Figure 8:
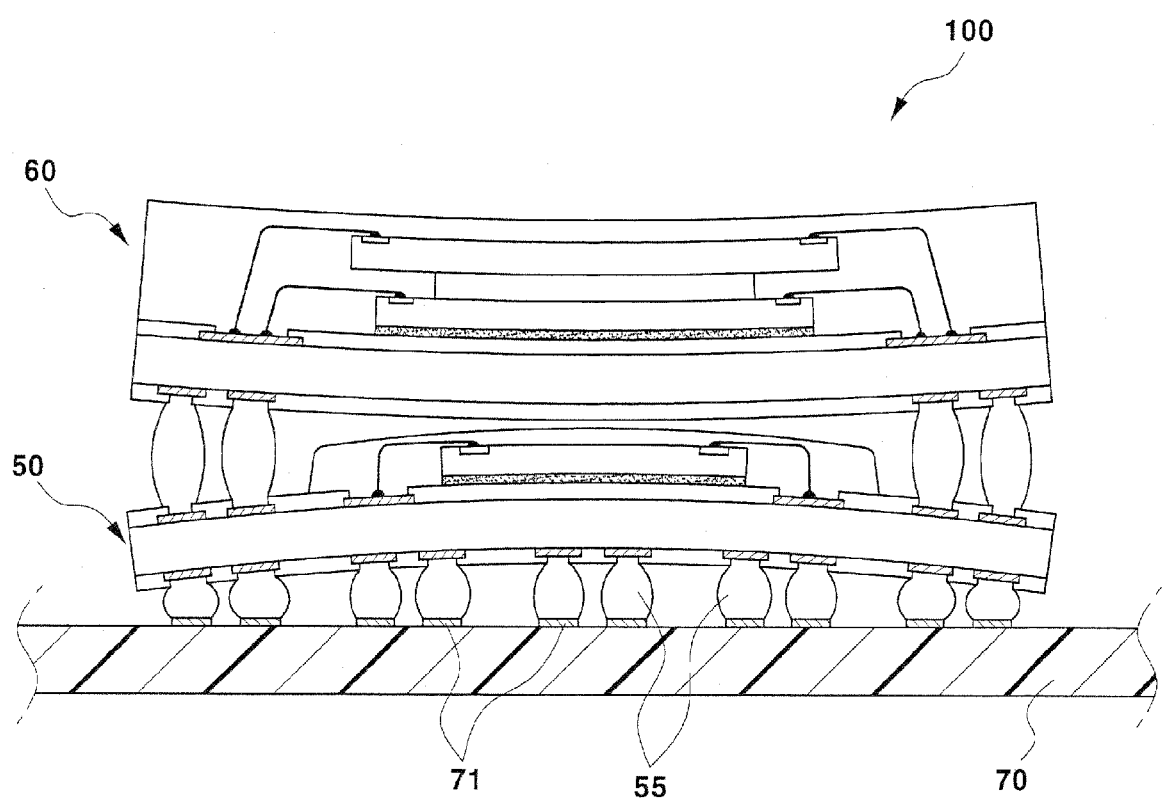
FIG. 8 is a sectional view showing a state in which the stack package of FIG. 7 is mounted on a motherboard.

In the same manner as with the mounting environment of a motherboard of a semiconductor package as described above, as shown in FIG. 8, excellent solder bonding reliability may be obtained when the stack package 100 is mounted on the motherboard 70 and the board level reliability test is performed. The stack package 100 is solder-bonded to board pads 71 of the motherboard 70 through solder balls 55 of the lower package 50.

Although stacked chip packages of BGA types are used as the upper package 60 in the example embodiment of the present invention, the present invention is not limited thereto, and various kinds of BGA packages may be used as the upper package.

By forming outer ball pads at the corners of a semiconductor package solder-bonded to a motherboard of relatively greater surface areas than those at other areas, and forming to have the greatest surface area within a designable range, contact areas between outer ball pads and solder balls formed at the corners increase and thereby board level reliability including solder bonding reliability may be improved.

Additionally, occurrence of cracks may be inhibited at junctions of other solder balls by forming dummy solder balls at the outermost corners among solder balls at the corners, so that the dummy solder balls can absorb stresses acting during the board level reliability test.

Thus, in the context of variation in pad surface area as a function of separation between opposing pads, departing from a pad surface area according to such scheme at the corner portions of a pad pattern and using, in the corner portions, pads of relatively greater surface area, i.e., greater than that otherwise used under the overall surface area variation scheme. Also, using dummy pads where faults are most likely to occur, i.e., using dummy pads at the outermost corner pads.

While the present invention has been described with reference to example embodiments thereof and accompanying drawings, it should be understood that the invention is not limited thereto. Various changes, substitutions and modifications may be made thereto by those skilled in the art without departing from the spirit and scope of the invention as defined by the appended claims.

What is claimed is:

1. A wiring substrate comprising:
a substrate body having an upper surface and lower surface, wherein an outer periphery of the lower surface includes outer corner regions and side regions extending between the outer corner regions;
a resin encapsulating area disposed on the upper surface of the substrate body and adapted to receive a semiconductor chip;
conductive wiring layers having bonding pads formed inside the resin encapsulating area and electrically connectable to a semiconductor chip when disposed within the resin encapsulating area;
upper ball pads formed on the upper surface of the substrate body; and
lower ball pads formed on the lower surface of the substrate body, wherein at least one of the wiring layers is electrically connected to at least one of the upper and lower ball pads,
wherein the lower ball pads include inner ball pads dispersed on a first area on the lower surface of the substrate opposite to the resin encapsulating area on the upper surface of the substrate, and outer ball pads dispersed on a second area on the lower surface of the substrate, wherein the second area surrounds the first area such that the outer ball pads are located in the outer periphery of the lower surface of the substrate,
wherein each of the outer ball pads has a greater surface area than each of the inner ball pads,
wherein the outer ball pads include first outer ball pads dispersed in each of the side regions of the outer periphery of the lower surface of the substrate, and second outer ball pads dispersed in each of the corner regions of the outer periphery of the lower surface of the substrate, and wherein each of the second outer ball pads has a greater surface area than each of the first outer ball pads.

2. The wiring substrate of claim 1, wherein each of the second outer ball pads has the greatest surface area among the lower ball pads.

3. The wiring substrate of claim 2, wherein the outer ball pads are dispersed in a plurality of concentric rows surrounding the first area of the lower surface of the substrate.

4. The wiring substrate of claim 2, wherein an outer periphery of the first area on the lower surface of the substrate includes corner regions and side regions extending between the corner regions, and wherein the inner ball pads comprise first inner ball pads dispersed in the side regions of the outer periphery of the first area on the lower surface of the substrate, and second inner ball pads dispersed in the corner regions of the outer periphery of the first area on the lower surface of the substrate, and wherein a surface area of each of the first inner balls pads is greater than a surface area of each of the second inner ball pads.

5. The wiring substrate of claim 4, wherein the first inner ball pads are formed in a plurality of concentric rows on the outer periphery of the first area of the lower surface of the substrate.

6. The wiring substrate of claim 4, wherein the inner ball pads further include third inner ball pads located in a central region of the first area, each of the third inner ball pads having a smaller surface area than each of the first and second inner ball pads.

7. The wiring substrate of claim 4, wherein the area containing the second outer ball pads is greater than the area containing the corner first inner ball pads.

8. The wiring substrate of claim 1, wherein the wiring substrate further comprises insulating protection layers covering both surfaces of the substrate body including the conductive wiring layers except for the bonding pads, upper ball pads and lower ball pads.

9. The wiring substrate of claim 1, wherein the second outer ball pads include dummy ball pads formed proximate to outermost corners of the lower surface.

10. The wiring substrate of claim 1, wherein the upper ball pads include dummy ball pads formed proximate to outermost corners of the upper surface.

11. A semiconductor package comprising:
a wiring substrate comprising a substrate body having an upper surface and lower surface, wherein an outer periphery of the lower surface includes outer corner regions and side regions extending between the outer corner regions, and a resin encapsulating area disposed on the upper surface of the substrate body and adapted to receive a semiconductor chip;
a semiconductor chip mounted on the resin encapsulating area of the wiring substrate; and
a resin encapsulating section sealing the resin encapsulating area including the semiconductor chip;
wherein the wiring substrate further comprises conductive wiring layers having bonding pads formed inside the resin encapsulating area and electrically connected to the semiconductor chip, upper ball pads disperse on the upper surface of the substrate body, lower ball pads dispersed on the lower surface of the substrate body, and solder balls formed on lower ball pads, wherein at least one of the wiring layers is electrically connected to at least one of the upper and lower ball pads, wherein the lower ball pads include inner ball pads dispersed on a first area on the lower surface of the substrate opposite to the resin encapsulating area on the upper surface of the substrate, and outer ball pads dispersed on a second area on the lower surface of the substrate, wherein the second area surrounds the first area such that the outer ball pads are located in the outer periphery of the lower surface of the substrate, wherein each of the outer ball pads has a greater surface area than each of the inner ball pads, wherein the outer ball pads include first outer ball pads dispersed in each of the side regions of the outer periphery of the lower surface of the substrate, and second outer ball pads dispersed in each of the corner regions of the outer periphery of the lower surface of the substrate, and wherein each of the second outer ball pads has a greater surface area than each of the first outer ball pads.

12. The semiconductor package of claim 11, wherein the second outer ball pads include dummy ball pads formed proximate outermost corners of the lower surface of the wiring substrate.

13. The semiconductor package of claim 12, wherein the solder balls include dummy solder balls connected to the dummy ball pads.

14. The semiconductor package of claim 11, wherein the upper ball pads include dummy ball pads formed proximate outermost corners of the upper surface of the wiring substrate.

15. The semiconductor package of claim 11, further comprising an upper semiconductor package stacked on the upper ball pads and coupled thereto by solder bonding.

16. The semiconductor package of claim 15, wherein the upper package is a ball grid array type semiconductor package having solder balls on a lower surface thereof corresponding to the upper ball pads.

17. The semiconductor package of claim 16, wherein the second outer ball pads include dummy ball pads formed proximate outermost corners of the lower surface of the wiring substrate.

18. The semiconductor package of claim 17, wherein the solder balls include dummy solder balls connected to the dummy ball pads.

19. The stack package of claim 15, wherein the upper ball pads include dummy ball pads formed proximate to the outermost corners of the upper surface of the wiring substrate.

20. The stack package of claim 19, wherein solder balls of the upper package include dummy solder balls connected to the dummy ball pads.

21. A wiring substrate comprising:
a substrate body having an upper surface and lower surface, wherein an outer periphery of each of lower surface includes outer corner regions and side regions extending between the outer corner regions;
a resin encapsulating area disposed on a central region of the upper surface of the substrate body; and
conductive wiring layers including upper ball pads formed outside the resin encapsulating area, and
lower ball pads formed on the lower surface of the substrate body and dispersed in the outer corner regions and the side regions of the outer periphery of the lower surface of the substrate body,
wherein each of the lower ball pads located in the corner regions of the outer periphery of the lower surface of the substrate has a larger surface area than each of the lower ball pads located in the side regions of the outer periphery of the lower surface of the substrate.

22. The wiring substrate of claim 21, wherein the lower ball pads further comprise inner ball pads dispersed in an area opposite to the resin encapsulating area and each having a surface area which is less than that of the lower ball pads dispersed in the outer periphery of the lower surface of the substrate body.

23. A semiconductor package comprising:
a wiring substrate comprising a substrate body having an upper surface and lower surface, wherein an outer periphery of the lower surface includes outer corner regions and side regions extending between the outer corner regions, and a resin encapsulating area disposed on the upper surface of the substrate body and adapted to receive a semiconductor chip;
a semiconductor chip mounted on the resin encapsulating area of the wiring substrate; and
a resin encapsulating section sealing the resin encapsulating area including the semiconductor chip;
wherein the wiring substrate further comprises conductive wiring layers including upper ball pads formed outside the resin encapsulating area, and lower ball pads formed on the lower surface of the substrate body and dispersed in the outer corner regions and the side regions of the outer periphery of the lower surface of the substrate body,
wherein each of the lower ball pads located in the corner regions of the outer periphery of the lower surface of the substrate has a larger surface area than each of the lower ball pads located in the side regions of the outer periphery of the lower surface of the substrate, and
wherein solder balls are formed on the lower ball pads of the wiring substrate.

24. The semiconductor package of claim 23, wherein the lower ball pads further comprise inner ball pads dispersed in an area opposite to the resin encapsulating area and each having a surface area which is less than that of the lower ball pads dispersed in the outer periphery of the lower surface of the substrate body.

25. The semiconductor package of claim 24, further comprising an upper package stacked on upper ball pads and coupled thereto by solder bonding.

26. The semiconductor package of claim 25, wherein the upper package is a ball grid array type semiconductor package formed with solder balls on a lower surface thereof corresponding to the upper ball pads.

* * * * *